United States Patent
Sorrell

(10) Patent No.: US 9,255,723 B2
(45) Date of Patent: Feb. 9, 2016

(54) DEVICE FOR CONVERTING HEAT INTO ELECTRICAL POWER

(71) Applicant: Bradford Scott Sorrell, Hubbards (CA)

(72) Inventor: Bradford Scott Sorrell, Hubbards (CA)

(*) Notice: Subject to any disclaimer, the term of this patent is extended or adjusted under 35 U.S.C. 154(b) by 0 days.

(21) Appl. No.: 14/062,039

(22) Filed: Oct. 24, 2013

(65) Prior Publication Data
US 2014/0116410 A1 May 1, 2014

Related U.S. Application Data

(60) Provisional application No. 61/720,724, filed on Oct. 31, 2012.

(51) Int. Cl.
| | |
|---|---|
| *H01L 35/28* | (2006.01) |
| *H01L 35/30* | (2006.01) |
| *F24H 9/00* | (2006.01) |
| *F24B 15/00* | (2006.01) |

(52) U.S. Cl.
CPC ........ *F24H 9/00* (2013.01); *F24B 15/00* (2013.01); *H01L 35/30* (2013.01); *F24H 2240/08* (2013.01)

(58) Field of Classification Search
CPC ........................................... H01L 35/00
See application file for complete search history.

(56) References Cited

U.S. PATENT DOCUMENTS

| | | | | |
|---|---|---|---|---|
| 5,315,830 | A * | 5/1994 | Doke et al. | 62/3.2 |
| 5,544,488 | A * | 8/1996 | Reid | 62/3.7 |
| 6,061,260 | A * | 5/2000 | Chen et al. | 363/141 |
| 7,596,956 | B2 * | 10/2009 | Lilke | 62/3.6 |
| 2003/0142712 | A1 * | 7/2003 | Ikeda et al. | 372/36 |
| 2004/0169771 | A1 * | 9/2004 | Washington et al. | 348/374 |
| 2007/0204627 | A1 * | 9/2007 | Pan | 62/3.2 |
| 2007/0221205 | A1 | 9/2007 | Landon | |

* cited by examiner

Primary Examiner — Jeffrey T Barton
Assistant Examiner — Uyen Tran
(74) Attorney, Agent, or Firm — Thompson Hine LLP

(57) ABSTRACT

A device for converting heat into electrical power. The device comprises a base made of a heat conducting material. The base has a substantially flat bottom surface for being placed onto a flat outside surface of a heat source. At least a thermoelectric generator element is disposed onto a top surface of the base such that a high temperature surface of the thermoelectric generator element is in thermal contact with the top surface of the base. A heat sink structure is in thermal contact with a low temperature surface of the at least a thermoelectric generator element. Electrical circuitry is connected to the at least a thermoelectric generator element for receiving the electrical power therefrom. At least an electrical output port is connected to the electrical circuitry for providing the electrical power.

13 Claims, 9 Drawing Sheets

DEVICE FOR CONVERTING HEAT INTO ELECTRICAL POWER

This application claims priority to U.S. Provisional Patent Application Ser. No. 61/720,724, filed on Oct. 31, 2012, the entire contents of which are hereby incorporated by reference.

FIELD

The present invention relates to thermoelectric converters, and more particularly to a device for converting heat generated by a stove into electrical power.

BACKGROUND

These days pellet stoves are increasingly used as a main home heating source. A typical pellet stove comprises a compartment to store pellets therein and a conveying mechanism for conveying the pellets to a combustion chamber. The pellets are ignited manually or with a heating element. A blower circulates air through a heat exchange apparatus or around the combustion chamber which is then expelled into the surrounding environment of the pellet stove.

Conventional pellet stoves rely on a reliable outside electrical power source for operating the conveying mechanism, the blower and, optionally, the heating element for initially igniting the pellets and can only ensure continued operation for a very short period of time during emergency power-outages. Therefore, the conventional pellet stove cannot be operated off-grid or during power outages. Furthermore, provision of outside electrical power typical adds cost to the operation of the pellet stove and requires an electrical outlet placed nearby, which may require rewiring of the home when newly installing a pellet stove.

In an attempt to overcome this drawback of the conventional pellet stoves, Landon teaches in U.S. Patent Application Pub. No. US 2007/0221205 "self-powering" technology.

Unfortunately, this technology is designed to be built into the pellet stove during manufacturing in close proximity to the combustion chamber and is, therefore, unsuitable as a retro-fit to existing pellet stoves.

It is desirable to provide a device for converting heat into electrical power that is simple and suitable as a retro-fit to existing stoves.

It is also desirable to provide a device for converting heat into electrical power that is easy to install as a retro-fit to existing stoves.

It is also desirable to provide a device for converting heat into electrical power that is capable of powering a pellet stove and further electrical devices.

SUMMARY

Accordingly, one object of the present invention is to provide a device for converting heat into electrical power that is simple and suitable as a retro-fit to existing stoves.

Another object of the present invention is to provide a device for converting heat into electrical power that is easy to install as a retro-fit to existing stoves.

Another object of the present invention is to provide a device for converting heat into electrical power that is capable of powering a pellet stove and further electrical devices.

According to one aspect of the present invention, there is provided a device for converting heat into electrical power. The device comprises a base made of a heat conducting material. The base has a substantially flat bottom surface for being placed onto a flat outside surface of a heat source. At least a thermoelectric generator element is disposed onto a top surface of the base such that a high temperature surface of the thermoelectric generator element is in thermal contact with the top surface of the base. A heat sink structure is in thermal contact with a low temperature surface of the at least a thermoelectric generator element. Electrical circuitry is connected to the at least a thermoelectric generator element for receiving the electrical power therefrom. At least an electrical output port is connected to the electrical circuitry for providing the electrical power.

According to the aspect of the present invention, there is provided a device for converting heat into electrical power. The device comprises a base made of a heat conducting material. The base has a substantially flat bottom surface for being placed onto a flat top surface of a heat source. At least a thermoelectric generator element is disposed onto a top surface of the base such that a high temperature bottom surface of the thermoelectric generator element is in thermal contact with the top surface of the base. A heat sink structure is disposed onto a low temperature top surface of the at least a thermoelectric generator element and in thermal contact therewith. Electrical circuitry is connected to the at least a thermoelectric generator element for receiving the electrical power therefrom. At least an electrical output port is connected to the electrical circuitry for providing the electrical power. A fan is placed such that when in operation an airstream generated by the fan increases transmission of heat from the heat sink structure to the air. A fan motor is connected to the electrical circuitry for actuating the fan.

An advantage of the present invention is that it provides a device for converting heat into electrical power that is simple and suitable as a retro-fit to existing stoves.

A further advantage of the present invention is that it provides a device for converting heat into electrical power that is easy to install as a retro-fit to existing stoves.

A further advantage of the present invention is to provide a device for converting heat into electrical power that is capable of powering a pellet stove and further electrical devices.

BRIEF DESCRIPTION OF THE DRAWINGS

An embodiment of the present invention is described below with reference to the accompanying drawings, in which.

DETAILED DESCRIPTION

Unless defined otherwise, all technical and scientific terms used herein have the same meaning as commonly understood by one of ordinary skill in the art to which the invention belongs. Although any methods and materials similar or equivalent to those described herein can be used in the practice or testing of the present invention, certain methods and materials are now described.

While the description of certain embodiments hereinbelow is with reference to a device for powering a pellet stove, it will become evident to those skilled in the art that the embodiments of the invention are not limited thereto, but are also applicable for powering electrical components of various other stoves such as, for example, fans/blowers of woodstoves as well as for powering various other electrical devices such as, for example, computers or lights.

Figure 1:
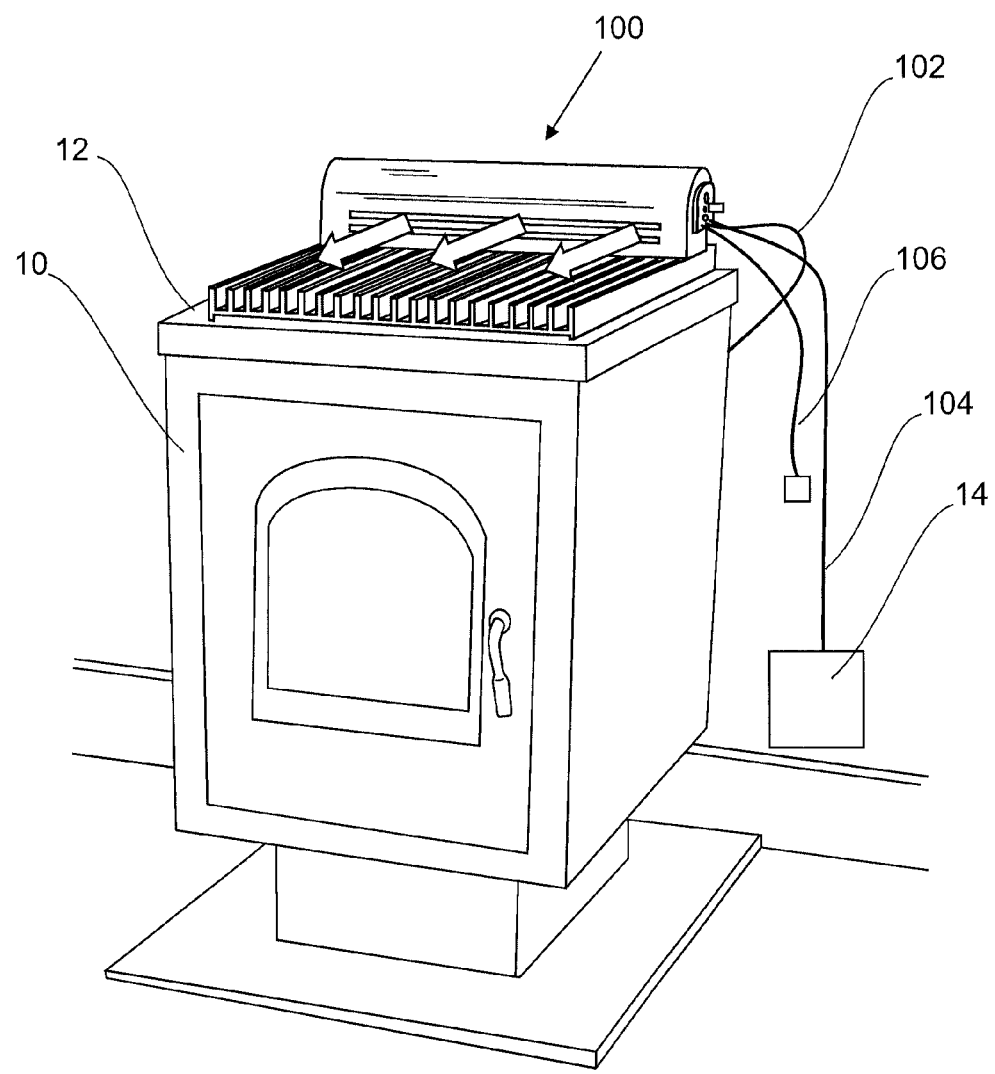
FIG. 1 is a simplified block diagram illustrating a perspective view of a device for converting heat into electrical power according to one embodiment of the invention with the device being employed for powering a pellet stove.

Referring to FIGS. 1 and 2a to 2e, a device 100 for converting heat into electrical power according to an embodiment of the invention is provided. As illustrated in FIG. 1, an embodiment of the device 100 for converting heat into electrical power is designed for being simply placed upon a flat top outside surface 12 of a pellet stove 10. In operation, the device 100 converts heat emitted from the pellet stove 10 into electrical power which is provided via output port/cable 102 to the pellet stove 10 for driving the electrical components thereof such as, for example, a pellet conveying mechanism and a blower. A fan disposed in the device 100—and also powered by the converted heat—generates an airstream over the top portion of the device 100 and the top surface 12 of the pellet stove 10 as indicated by the block arrows for heating a space surrounding the pellet stove 10. Port/cable 104 connects the device 100 to a battery, such as a rechargeable battery, for receiving electrical power therefrom when starting the pellet stove 10 and, in one case, for charging the same when in operation. Furthermore, the device 100 comprises one or more output ports/cables/connectors 106 to power/charge various other electrical devices such as, for example, lights, computers and smart phones.

Base 108 of the device 100 for converting heat into electrical power is made of a heat conducting material such as, for example, aluminum, and comprises: substantially flat base plate 108A; fins 108B protruding therefrom in an upward direction; and, supports 108C protruding therefrom in a downward direction. The base 108 can be made as a single unit using standard aluminum manufacturing technologies. Optionally, the supports 108C are omitted and the base plate 108A is placed directly onto the top surface 12 of the pellet stove 10. One or more thermoelectric generator elements 120 are disposed on an end portion of the top surface 108A.1 of the base 108A such that high temperature surface 120A of the thermoelectric generator element 120 is in thermal contact with the top surface 108A.1 of the base 108A.

Thermoelectric generators are devices that convert heat and, more particularly, a temperature difference at a junction of different materials, into electrical power based on the "Seebeck effect" or "thermoelectric effect." Numerous off-the-shelf state of the art thermoelectric generators employing, for example, semiconductor p-n junctions, are readily available for different operating temperatures and electrical output power. It is noted that the thermoelectric generators are also sold as Peltier elements/modules.

In order to generate a temperature difference at the junction of the thermoelectric generator element 120 heat sink structure 122A, 122B is disposed onto low temperature top surface 120B of the thermoelectric generator element 120 and in thermal contact therewith. The heat sink structure 122A, 122B can comprise a heat sink base plate 122A—placed onto the low temperature top surface 120B of the thermoelectric generator element 120—and heat sink fins 122B protruding therefrom in an upward direction. A fan is provided such that when in operation an airstream generated by the fan increases transmission of heat from the heat sink structure 122A, 122B to the air and, therefore, increases the temperature difference at the junction of the thermoelectric generator element 120 and, consequently, the electrical power produced by the thermoelectric generator element 120. The fan provided can be a cross-flow fan—also known as a "squirrel cage fan"—with the heat sink structure 122A, 122B being disposed inside housing 112 of the cross-flow fan. Impeller 126 is rotatable—about axis 128—mounted to the housing 112 and actuated by electrical motor 118 which is connected to the impeller 126 for actuating the same and mounted to the housing 112. In operation, the impeller 126 draws air inside the housing through inlet opening 114 and propels the same to generate the airstream which is then expelled through openings louvers 116 disposed in the housing 112, as indicated by the block arrows in FIGS. 2a and 2b. The heat sink fins 122B can be oriented substantially parallel to the airstream and are designed such that they surround a bottom portion of the impeller 126.

Figure 2A:
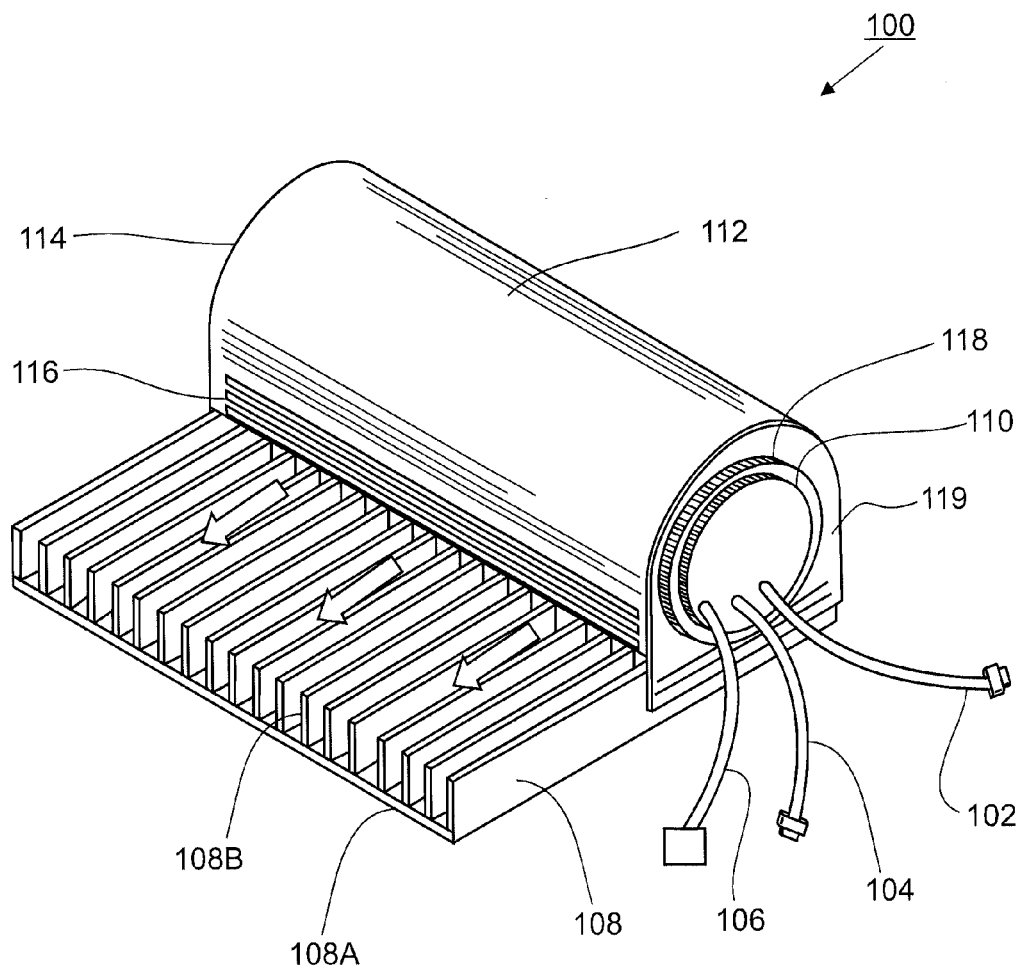
FIGS. 2a to 2c are simplified block diagrams illustrating a perspective top view, a cross sectional side view, and an exploded view, respectively, of the device for converting heat into electrical power according to an embodiment of the invention.
Figure 2B:
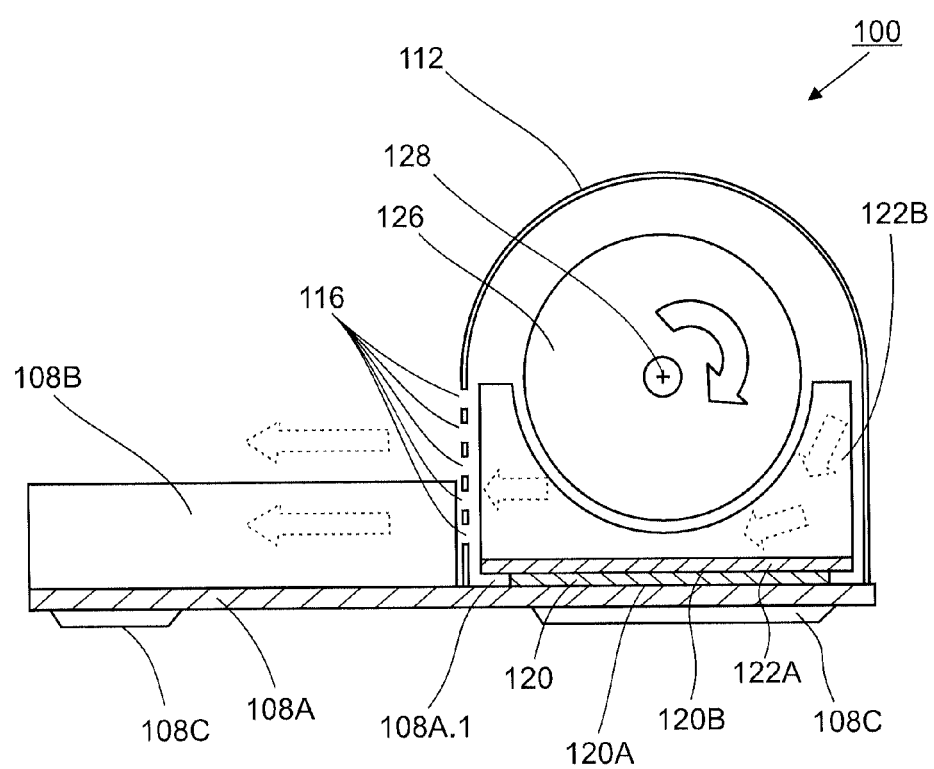
Figure 2C:
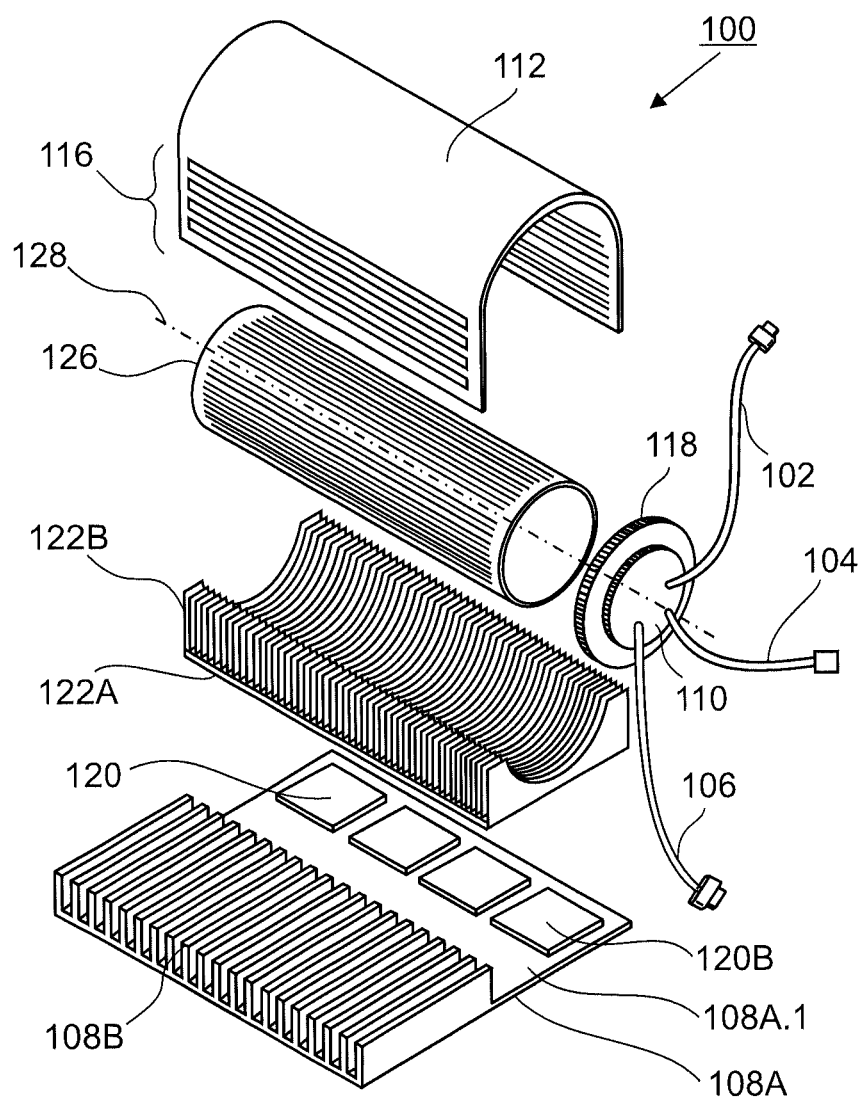
Figure 2D:
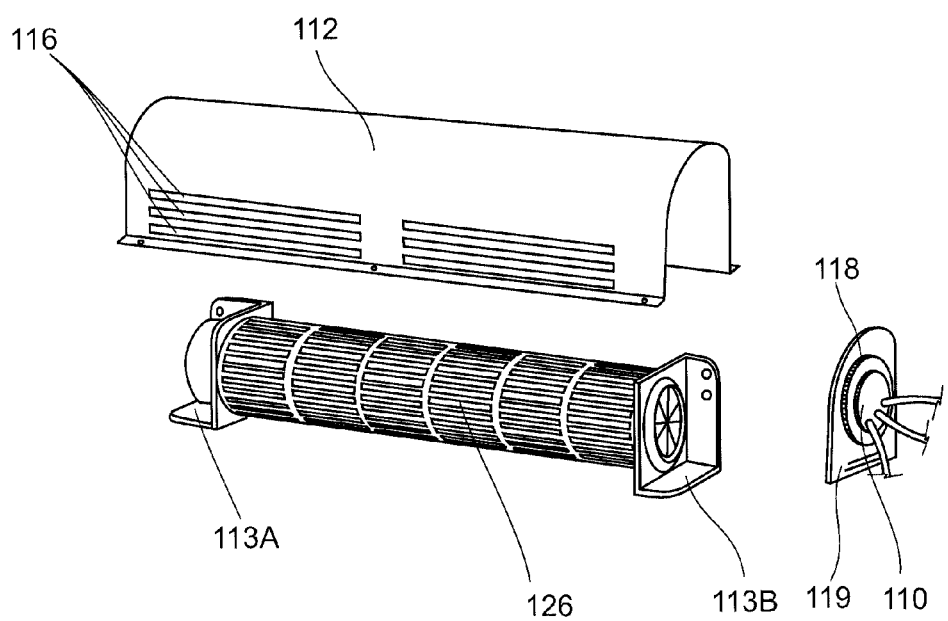
FIG. 2d is a simplified block diagram illustrating an exploded view of the fan of the device for converting heat into electrical power according to an embodiment of the invention.

Employment of the fan fulfills a dual purpose by, firstly, increasing heat transmission from the heat sink structure 122A, 122B resulting in an increased electrical power generated by the thermoelectric generator elements 120 and, secondly, generating an airstream for circulating warm air in the vicinity of the pellet stove 10. As illustrated in FIG. 2a, the fins 108A are oriented substantially parallel to the airstream—as indicated by the block arrows—in order to further transmit heat to the airstream after exiting the fan housing 112. Optionally, the fins 108A are omitted and, therefore, the base 108 may be shortened to enable employment of the device 100 in situations where the top surface 12 is smaller, for example, when the pellet stove is provided as a fire place insert.

The thermoelectric generator elements 120 can be "sandwiched" between the top surface 108A.1 of the base plate 108A and the heat sink base plate 122A. The heat sink base plate 122A is mounted to the base plate 108A or the fan housing 112—also mounted to the base plate 108A—in a conventional manner using standard fasteners such as, for example, screws. It is noted that the thermal bridges provided by the fasteners—which are typically made of a thermal conducting metal—do not have a noticeable impact on the efficiency of the heat sink structure 122A, 122B. Optionally, thermal insulators made of, for example, a suitable heat resistant plastic material, are employed, as is well known to one skilled in the art.

The heat sink structure 122A, 122B can be made of aluminum with the heat sink base plate 122A having a thickness sufficient for conducting the heat to the heat sink fins 122B. The heat sink fins 122B can be made of aluminum sheet material having a thickness sufficient for conducting the heat inside the fin but also to allow provision of a sufficiently large number of fins 122B within the limited space of the housing 112. The heat sink structure 122A, 122B is assembled in a conventional manner, for example, by disposing grooves in the heat sink base plate 108A such that they provide a tight fit with the respective heat sink fins 122B inserted therein.

Numerous off-the-shelf state of the art cross-flow fans are readily available in different sizes. Typically these fans comprise the impeller 126 rotatable movable mounted to housing end elements 113A, 113B which are fastened to the base plate 108A in a conventional manner using standard fasteners such as, for example, screws. Housing cover 112 surrounding the impeller 126 is also fastened to the base plate 108A in a conventional manner or, alternatively to the housing end elements 113A, 113B. Actuator housing 119 comprising motor 118 is mounted to the housing end element 113B such that the motor is coupled to the impeller 126.

Figure 2E:
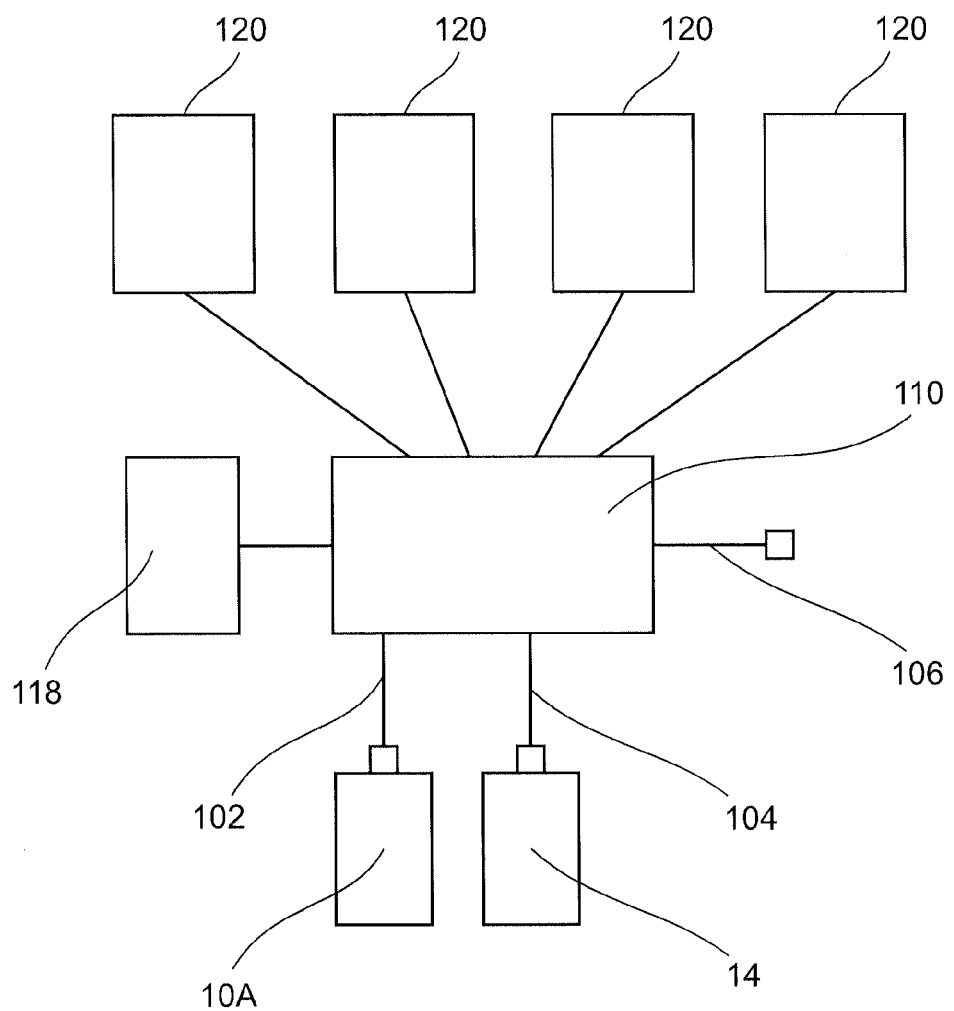
FIG. 2e is a simplified flow diagram illustrating the electric circuitry of the device for converting heat into electrical power according to an embodiment of the invention.

Electrical circuitry 110 is connected to each of the thermoelectric generator elements 120 for receiving the electrical power therefrom, as illustrated in FIG. 2e. The electrical circuitry 110 controls provision of the electrical power to: fan motor 118; the electrical components 10A of the pellet stove 10 via output port/cable 102; and, other electrical devices via output port 106. Furthermore, the electrical circuitry 110 controls provision of the electrical power to the battery 14 via output port/cable 104 for charging the same or receipt of electrical power therefrom when starting the pellet stove 10.

The electrical circuitry 110 can be implemented using standard off-the-shelf 12 Volt voltage controller components and is housed adjacent the actuator housing 119 or incorporated therein.

In an exemplary implementation the device 100 for converting heat into electrical power is provided as a retro-fit kit for providing electrical power for operating a pellet stove 10, as illustrated in FIG. 1. For generating the electrical power 4 thermoelectric generator elements 120 sold, for example, by "A-1 Electronic Parts" as semiconductor Peltier Modules. Each Peltier Module can have a dimension of 4 cm×4 cm×4 mm and maximum ratings of 13.5V, 4.4A, 36W at a maximum temperature difference of 59° C. 4 thermoelectric generator elements 120 may be utilized in order to reach the voltage of 12V for driving the pellet conveying mechanism sooner during a cold-start of the pellet stove—with each thermoelectric generator element 120 generating approximately 3V—thus reducing the electrical power drawn from the battery 14. The battery 14 can be a 12V 3.2Ah sealed lead acid rechargeable battery sold, for example, by "Battery-Mart." The cross-flow fan can be a 12V squirrel cage fan FCB-34AE12 sold, for example, by "A-1 Electronic Parts." The retro-fit device 100 also includes a 12V DC gear motor for replacing an existing 110V AC gear motor of the pellet stove. 12V gear motors are sold, for example, by "Gleason Avery." Alternatively, the retro-fit device 100 contains a DC-AC converter for operating an existing 110V AC gear motor of the pellet stove.

Figure 3A:
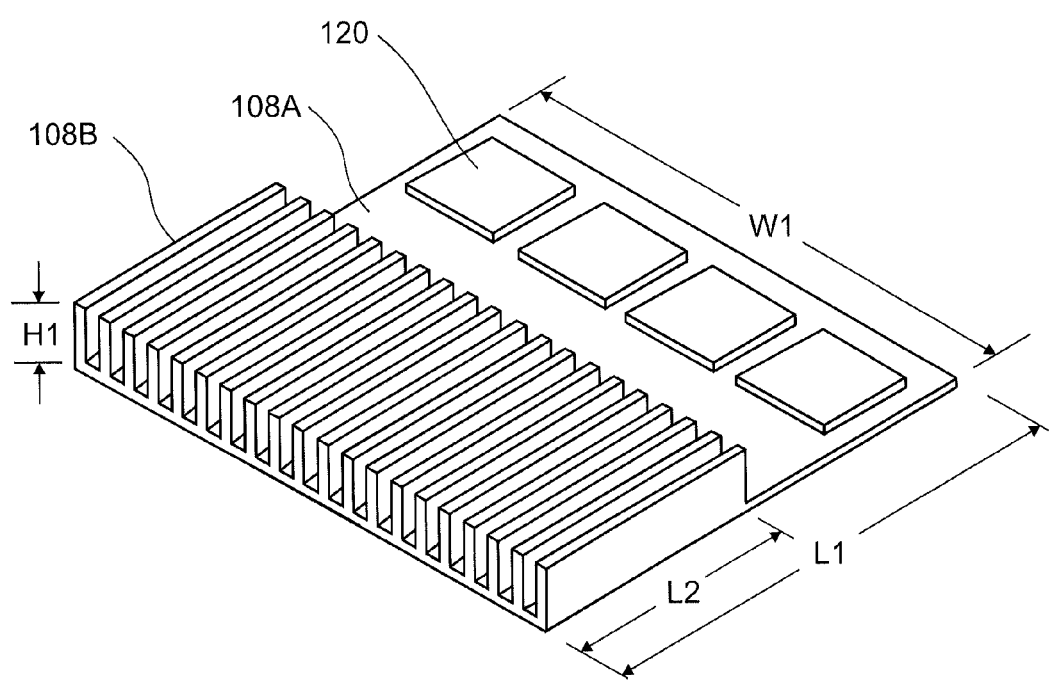
FIGS. 3a and 3b are simplified block diagrams illustrating dimensions of main components of an exemplary implementation of the device for converting heat into electrical power according to an embodiment of the invention; and, FIGS. 4a and 4b are simplified block diagrams illustrating operation of the thermoelectric generator elements of the exemplary implementation of the device for converting heat into electrical power according to an embodiment of the invention.
Figure 3B:
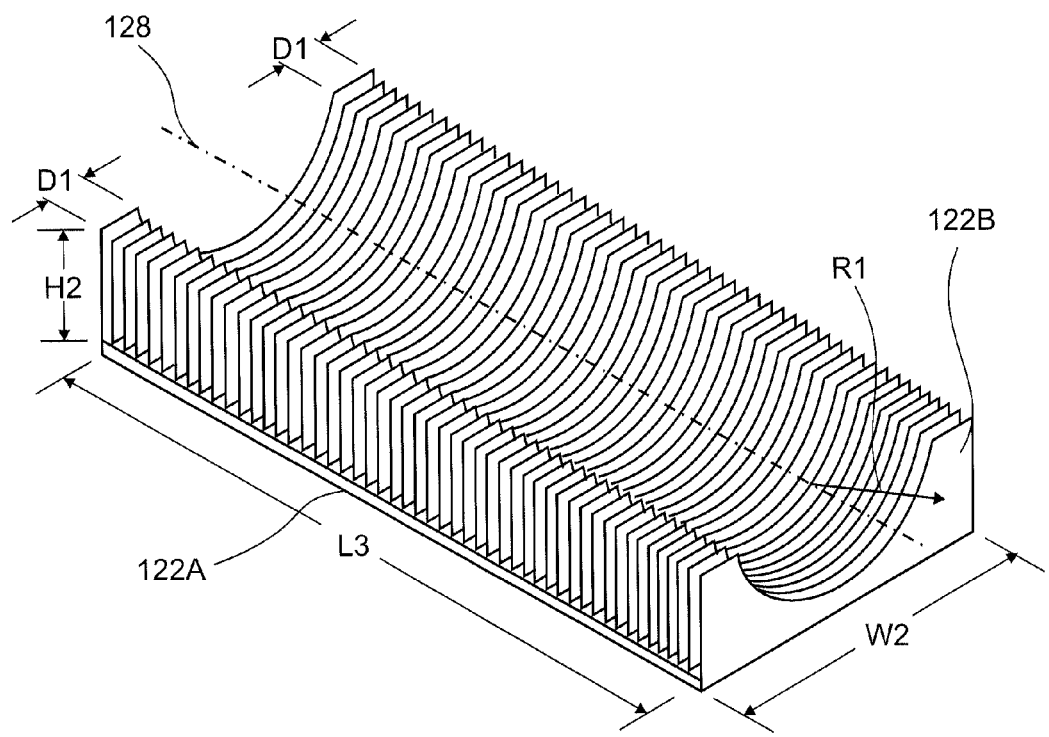

Referring to FIGS. 3a and 3b, the dimensions of the main components of the device 100 can be: base plate 108A made of aluminum having length L1 of 204 mm, width W1 of 230 mm, and a thickness of 3 mm;

21 base fins 108B made of aluminum having length L2 of 102 mm, height H1 of 26 mm, and a thickness of 2 mm;

heat sink base plate 108A made of aluminum having length L3 of 224 mm, width W2 of 102 mm, and a thickness of 2 mm; and 150 heat sink fins 122B made of aluminum having length W2 of 102 mm, height H2 of 33 mm, distance D1 of 12 mm, radius R1 of 39 mm (leaving a 1 mm gap to the impeller 126), and a thickness of 0.5 mm.

Figure 4A:
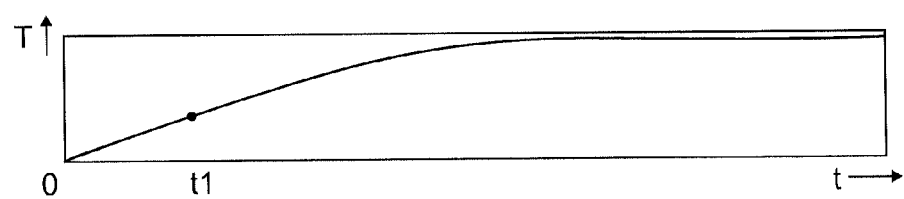
Figure 4B:
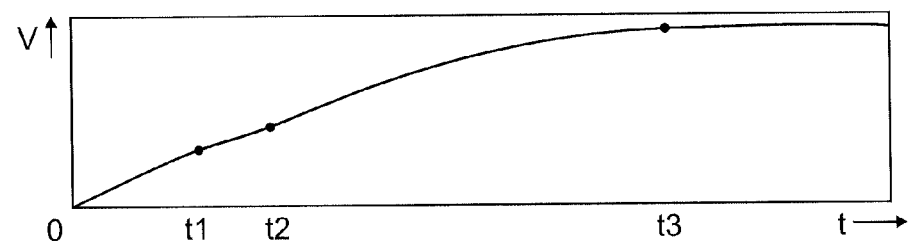

FIGS. 4a and 4b illustrate the operation of the Peltier Modules during a "cold start" of the pellet stove 10. At first, the gear motor for driving the pellet conveying mechanism is powered using the battery 14 until the temperature difference at the Peltier Modules is sufficient (at a stove temperature of approximately 60° C.)—at time t1—when the Peltier Modules generate 4×3V=12V. At time t1 the voltage controller 110 directs all the generated electrical power to the gear motor and stops drawing electrical power from the battery 14. At time t2 when the Peltier Modules generate 4V each, the voltage controller maintains provision of 12V to the gear motor and directs 4V to the fan motor 118. The fan begins to turn, decreasing the temperature of the heat sink structure 122A, 122B and, thus, increasing the temperature difference across the junction of the Peltier Modules, consequently, increasing the electrical output of the Peltier Modules. The voltage controller 110 maintains the 12V to the gear motor while increasing the voltage provided top the fan motor 118 driving the same faster. After time t3 the voltage produced by each of the Peltier Modules remains substantially constant at approximately 75% of the maximum output voltage which is sufficient to operate the gear motor, the fan motor 118, trickle charge the battery 14, and some additional electrical devices.

The present invention has been described herein with regard to certain embodiments. However, it will be obvious to persons skilled in the art that a number of variations and modifications can be made without departing from the scope of the invention as described herein.

What is claimed is:

1. A device for converting heat into electrical power comprising:
   a base made of a heat conducting material and having a substantially flat bottom surface for being placed onto a flat outside surface of a heat source;
   at least a thermoelectric generator element disposed onto a top surface of the base such that a high temperature surface of the thermoelectric generator element is in thermal contact with the top surface of the base;
   a heat sink structure in thermal contact with a low temperature surface of the at least a thermoelectric generator element;
   electrical circuitry connected to the at least a thermoelectric generator element for receiving the electrical power therefrom;
   at least an electrical output port connected to the electrical circuitry for providing the electrical power; and,
   a fan and a fan motor connected to the electrical circuitry for actuating the fan, the fan having an elongated cylindrical impeller disposed in a housing and rotatable about a rotational axis, with the rotational axis being its longitudinal axis, for generating an airstream oriented substantially perpendicular to the rotational axis, wherein the heat sink structure comprises a plurality of fins disposed in the housing along the rotational axis of the impeller and oriented substantially perpendicular thereto, each of the fins having a cut-out accommodating a portion of the impeller therein.

2. The device according to claim 1 wherein the electrical circuitry is adapted for providing the electrical power to electric components of the heat source.

3. The device according to claim 1 comprising a battery port connected to the electrical circuitry, the battery port for connecting the electrical circuitry to a battery.

4. The device according to claim 1 wherein the base comprises a substantially flat base plate having the at least a thermoelectric generator element disposed on an end portion thereof and fins protruding from a remaining portion thereof and wherein the fins are oriented substantially parallel to an airstream generated by the fan.

5. A device for converting heat into electrical power comprising:

a substantially flat base plate made of a heat conducting material and having a substantially flat bottom surface for being placed onto a flat top surface of a heat source;

at least a thermoelectric generator element disposed onto a top surface of the base such that a high temperature bottom surface of the thermoelectric generator element is in thermal contact with the top surface of the base;

a heat sink structure disposed onto a low temperature top surface of the at least a thermoelectric generator element and in thermal contact therewith;

electrical circuitry connected to the at least a thermoelectric generator element for receiving the electrical power therefrom;

at least an electrical output port connected to the electrical circuitry for providing the electrical power;

a fan and a fan motor connected to the electrical circuitry for actuating the fan, the fan being placed onto an end portion of the base plate such that an airstream generated by the fan is blown over a remaining portion of the base plate, wherein the fan comprises an elongated cylindrical impeller disposed in a housing and rotatable about a rotational axis, with the rotational axis being its longitudinal axis, for generating an airstream oriented substantially perpendicular to the rotational axis;

a plurality of fins disposed on the top surface of the remaining portion of the base plate and oriented substantially parallel to the airstream; and, openings disposed in the housing in close proximity to the base plate for directing the airstream over the remaining portion of the base plate in close proximity thereto such that a substantial portion of the airstream is blown between the fins.

6. The device according to claim 5 wherein the heat sink structure comprises a plurality of fins disposed in the housing along the rotational axis of the impeller and oriented substantially perpendicular thereto.

7. The device according to claim 6 wherein each of the fins has a cut-out accommodating a portion of the impeller therein.

8. The device according to claim 1 wherein the cut-out of each of the fins is adapted for accommodating approximately a bottom half of the impeller therein.

9. The device according to claim 8 wherein the cut-out of each of the fins is shaped to form approximately a semi-circle.

10. The device according to claim 1 wherein the fins are made of a sheet material.

11. The device according to claim 10 wherein the heat sink structure comprises a heat sink base plate having grooves disposed therein such that they provide a tight fit with the respective fins inserted therein.

12. The device according to claim 1 wherein the heat sink structure comprises more than 50 fins.

13. The device according to claim 4 wherein the housing comprises openings disposed in close proximity to the base plate for directing the airstream over the base plate in close proximity thereto such that a substantial portion of the airstream is blown between the fins protruding from the base plate.

* * * * *